(12) United States Patent
Kubota et al.

(10) Patent No.: US 9,722,114 B2
(45) Date of Patent: Aug. 1, 2017

(54) PHOTOVOLTAIC CELL MOUNTING SUBSTRATE AND PHOTOVOLTAIC CELL MODULE

(71) Applicant: SHINKO ELECTRIC INDUSTRIES CO., LTD., Nagano (JP)

(72) Inventors: Kazuyuki Kubota, Nagano (JP); Tomoharu Fujii, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 14/683,259

(22) Filed: Apr. 10, 2015

(65) Prior Publication Data

US 2015/0311855 A1    Oct. 29, 2015

(30) Foreign Application Priority Data

Apr. 28, 2014 (JP) ................. 2014-092948

(51) Int. Cl.
| | |
|---|---|
| H02N 6/00 | (2006.01) |
| H01L 31/042 | (2014.01) |
| H01L 31/0352 | (2006.01) |
| H01L 31/0224 | (2006.01) |
| H01L 31/048 | (2014.01) |
| H01L 31/054 | (2014.01) |

(52) U.S. Cl.
CPC ........ *H01L 31/035281* (2013.01); *H01L 31/022425* (2013.01); *H01L 31/042* (2013.01); *H01L 31/048* (2013.01); *H01L 31/0543* (2014.12); *Y02E 10/52* (2013.01)

(58) Field of Classification Search
CPC ............ H02S 20/00; H01L 31/035281; H01L 31/042; H01L 31/048; H01L 31/0543; H01L 31/022425; Y02E 10/50; Y02E 10/52
USPC ....................... 136/251; 248/346.11
See application file for complete search history.

(56) References Cited

U.S. PATENT DOCUMENTS

| | | | | |
|---|---|---|---|---|
| 4,223,174 A * | 9/1980 | Moeller | .................. | F24J 2/05 126/577 |
| 4,392,482 A * | 7/1983 | Chang | ................... | F24J 2/0488 126/683 |
| 4,473,065 A * | 9/1984 | Bates | ......................... | F24J 2/07 126/635 |
| 6,355,873 B1 * | 3/2002 | Ishikawa | ............. | H01L 31/0272 136/244 |
| 2002/0096206 A1 * | 7/2002 | Hamakawa | ........... | H01L 31/042 136/244 |
| 2004/0238833 A1 * | 12/2004 | Nakata | ................ | H01L 25/0753 257/88 |
| 2010/0108121 A1 * | 5/2010 | Liu | ............................ | F24J 2/08 136/246 |

(Continued)

FOREIGN PATENT DOCUMENTS

JP     2001-339086     12/2001

*Primary Examiner* — Tamir Ayad
(74) *Attorney, Agent, or Firm* — IPUSA, PLLC

(57) ABSTRACT

A photovoltaic cell mounting substrate includes a substrate; and a plurality of grooves provided at one surface of the photovoltaic cell mounting substrate, the plurality of grooves including a first groove and a second groove that is placed at a circumferential side of the first groove, at the one surface of the substrate, the second groove being formed deeper than the first groove, with respect to the one surface of the substrate.

10 Claims, 4 Drawing Sheets

(56) References Cited

U.S. PATENT DOCUMENTS

2010/0148319 A1* 6/2010 Wang ................ H01L 31/0236
257/627
2010/0186820 A1* 7/2010 Schon ...................... F24J 2/12
136/259

* cited by examiner

PHOTOVOLTAIC CELL MOUNTING SUBSTRATE AND PHOTOVOLTAIC CELL MODULE

CROSS-REFERENCE TO RELATED APPLICATION

The present application is based on and claims the benefit of priority of Japanese Priority Application No. 2014-092948 filed on Apr. 28, 2014, the entire contents of which are hereby incorporated by reference.

BACKGROUND OF THE INVENTION

1. Field of the Invention

The present invention relates to a photovoltaic cell mounting substrate and a photovoltaic module.

2. Description of the Related Art

Conventionally, a photovoltaic cell mounting substrate is known that includes a plate substrate on which a plurality of photovoltaic cells are mountable and reflection patterns are provided at the circumference is known. Further, a photovoltaic cell mounting substrate is known that includes a plate substrate at a surface of which a plurality of strip concave portions is formed and a plurality of photovoltaic cells (spherical cells, for example) are mounted on the plate substrate while being aligned along a longitudinal direction of each of the concave portions (see Patent Document 1, for example).

However, for the conventional photovoltaic cell mounting substrate, the plurality of photovoltaic cells are mounted at the same height. Thus, in a photovoltaic cell module including the photovoltaic cell mounting substrate and the plurality of photovoltaic cells that are mounted on the substrate, the light receiving amount of a photovoltaic cell that is placed at a center side becomes smaller compared with the light receiving amount of a photovoltaic cell that is placed at a circumferential side. Then, this becomes a factor to lower the total electrical efficiency of the photovoltaic cell module.

PATENT DOCUMENT

[Patent Document 1] Japanese Laid-open Patent Publication No. 2001-339086

SUMMARY OF THE INVENTION

The present invention is made in light of the above problems, and provides a photovoltaic cell mounting substrate or the like capable of improving electrical efficiency when mounting photovoltaic cells thereon.

According to an embodiment, there is provided a photovoltaic cell mounting substrate includes a substrate; and a plurality of grooves provided at one surface of the photovoltaic cell mounting substrate, the plurality of grooves including a first groove and a second groove that is placed at a circumferential side of the first groove, at the one surface of the substrate, the second groove being formed deeper than the first groove, with respect to the one surface of the substrate.

Note that also arbitrary combinations of the above-described elements, and any changes of expressions in the present invention, made among methods, devices, systems and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1A:
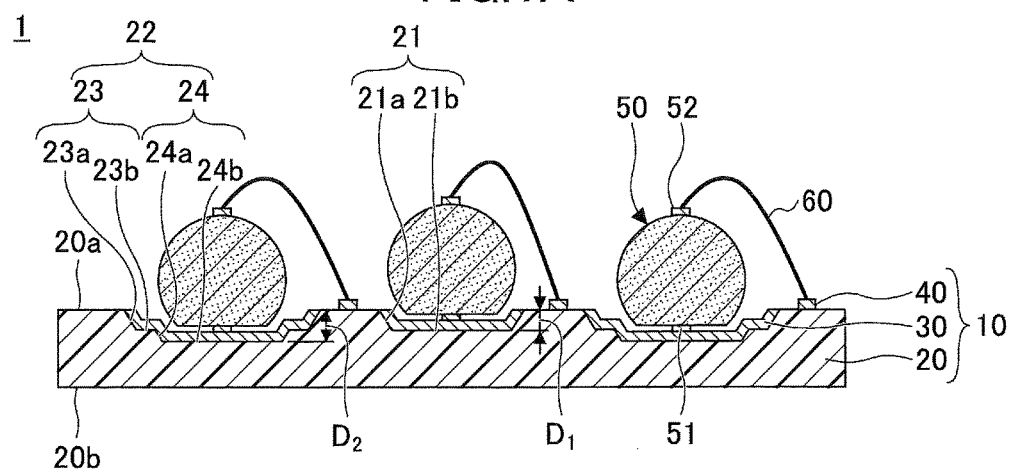
FIG. 1A and FIG. 1B are views illustrating an example of a photovoltaic cell module of a first embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First Embodiment

Figure 1B:
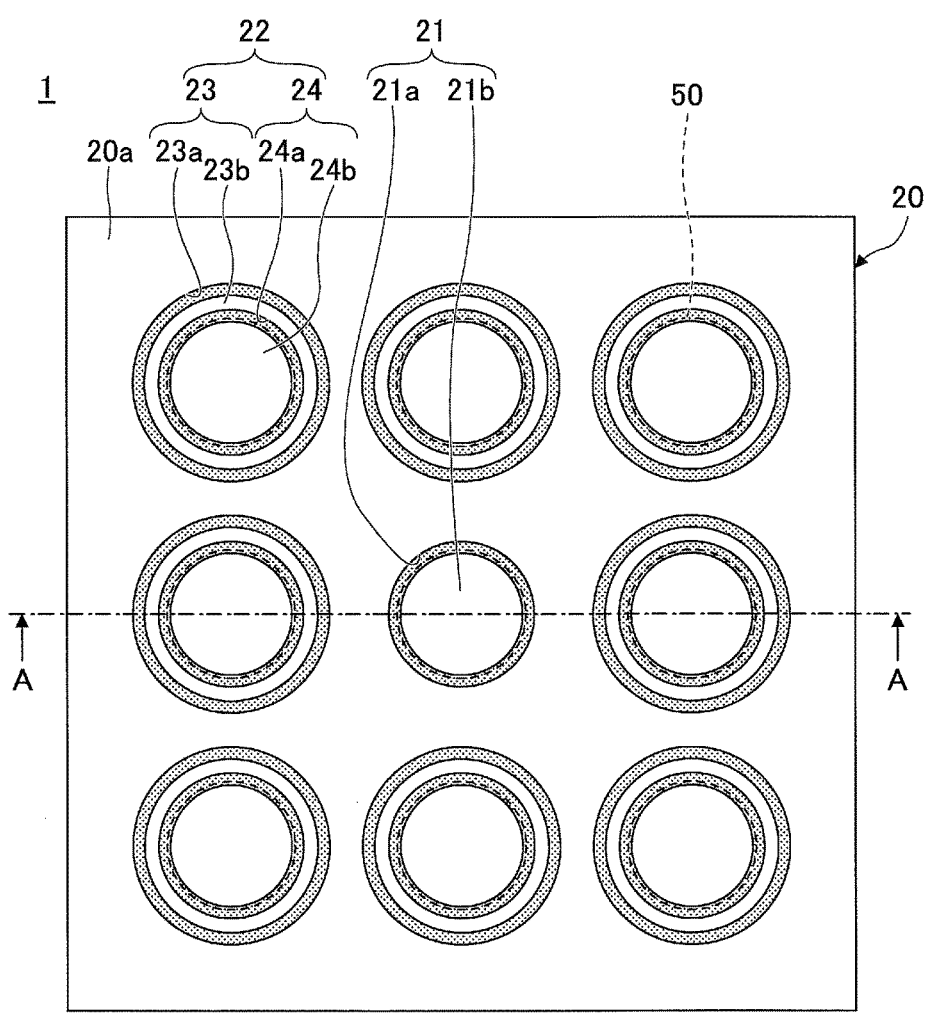

FIG. 1A and FIG. 1B are views illustrating an example of a photovoltaic cell module 1 of the first embodiment. FIG. 1B is a plan view and FIG. 1A is a cross-sectional view taken along an A-A line in FIG. 1B. Here, FIG. 1B illustrates a part of the structure illustrated in FIG. 1A. Further, for an illustration purpose, an inner wall surface of each of the grooves is illustrated by a dot pattern in FIG. 1B.

With reference to FIG. 1A and FIG. 1B, the photovoltaic cell module 1 includes a photovoltaic cell mounting substrate 10, a plurality of photovoltaic cells 50 and bonding wires 60. The photovoltaic cell mounting substrate 10 includes a substrate 20, a metal layer 30 and pads 40. The photovoltaic cell mounting substrate 10 is configured to be capable of mounting the plurality of photovoltaic cells 50.

In this embodiment, a photovoltaic cells 50 side is referred to as an upper side or one side, and a substrate 20 side is referred to as a lower side or the other side. Further, a surface of each component at the photovoltaic cells 50 side is referred to as an upper surface or one surface, and a surface of each component at the substrate 20 side is referred to as a lower surface or the other surface. However, the photovoltaic cell module 1 may be used in an opposite direction or may be used at an arbitrary angle. Further, in this embodiment, "in a plan view" means that an object is seen in a direction that is normal to one surface 20a of the substrate 20, and a "plan shape" means a shape of an object seen in the direction that is normal to the one surface 20a of the substrate 20.

For the substrate 20, for example, a resin substrate (including epoxy-based resin as a main constituent, for example), a ceramic substrate, a silicon substrate or the like may be used. The thickness of the substrate 20 may be, for example, about a few hundred μm to a few mm. The substrate 20 may be, for example, a stacked structure of a plurality of insulating layers and wiring layers. Further, a wiring, an external connection terminal or the like may be provided at another surface 20b of the substrate 20.

The substrate 20 is provided with a plurality of grooves including a first groove 21 and second grooves 22 at the one surface 20a of the substrate 20. The first groove 21 and the second grooves 22 are provided for mounting the photovoltaic cells 50, and have a function such as to determine the positions of the photovoltaic cells 50. The first groove 21 and the second grooves 22 may be, for example, formed by machining, laser processing or the like. The number of the first groove 21 and the second grooves 22 may be arbitrarily determined. In this embodiment, as an example, the substrate 20 is provided with a single first groove 21 and eight of the second grooves 22 at a circumferential side around the first groove 21, at the one surface 20a. In this embodiment, each of the first groove 21 and the second grooves 22 is configured to mount a single photovoltaic cell 50 and thus the photovoltaic cell mounting substrate 10 is capable of mounting nine of the photovoltaic cells 50 at maximum.

The single first groove 21 is provided at substantially center of the one surface 20a of the substrate 20. The second grooves 22 are placed at the one surface 20a of the substrate 20 in a lattice-like manner such that to surround the circumference of the first groove 21. However, as long as the second grooves 22 are placed to surround the circumference of the first groove 21, the second grooves 22 may not be placed in a lattice-like manner and, for example, the second grooves 22 may be placed in a zigzag manner.

The depth $D_2$ of each of the second grooves 22 with respect to the one surface 20a of the substrate 20 is deeper than the depth $D_1$ of the first groove 21 with respect to the one surface 20a of the substrate 20. The depth $D_1$ may be arbitrarily determined based on the size or the like of the photovoltaic cell 50 to mount and may be, for example, about a few ten to a few hundred μm. The depth $D_2$ may be, for example, about twice of the depth $D_1$.

The first groove 21 has an inner wall surface 21a and a bottom surface 21b that is continuously formed from the inner wall surface 21a. The plan shape of the first groove 21 may be, for example, a circular shape. When the photovoltaic cell 50 to mount has a spherical shape whose diameter is about 1.0 to 2.0 mm, the diameter of the first groove 21 may be, for example, about 1.0 to 2.0 mm. The inner wall surface 21a of the first groove 21 may have a tapered shape where the one surface 20a side of the substrate 20 is wider, for example, and alternatively, the inner wall surface 21a of the first groove 21 may be substantially perpendicular to the one surface 20a of the substrate 20.

Each of the second grooves 22 has a stepped structure where a step is provided at the inner wall surface. In other words, each of the second grooves 22 includes a first concave portion 23 (depth $D_1$) whose depth is substantially the same as that of the first groove 21 and a second concave portion 24 (depth $D_2$) that is formed at a substantially center portion of a bottom surface of the first concave portion 23 and smaller than the first concave portion 23 such that to be one step deeper (lower) than the first concave portion 23.

The first concave portion 23 has an inner wall surface 23a and a bottom surface 23b that is continuously formed from the inner wall surface 23a. The second concave portion 24 has an inner wall surface 24a and a bottom surface 24b that is continuously formed from the inner wall surface 24a. The inner wall surface 24a of the second concave portion 24 is continuously formed from the bottom surface 23b of the first concave portion 23 to form the continuous stepped structure.

The plan shape of the second concave portion 24 may be, for example, a circular shape whose diameter is about the same as that of the first groove 21. The plan shape of the first concave portion 23 may be a circular shape whose diameter is larger than that of the second concave portion 24 by about a few ten to a few hundred μm. The first concave portion 23 and the second concave portion 24 may be concentrically formed.

The inner wall surface 23a of the first concave portion 23 and the inner wall surface 24a of the second concave portion 24 may have a tapered shape where the one surface 20a side of the substrate 20 is wider, for example. Alternatively, the inner wall surface 23a of the first concave portion 23 and the inner wall surface 24a of the second concave portion 24 may be substantially perpendicular to the one surface 20a of the substrate 20. Here, the second groove 22 may not have the stepped structure (the structure including the first concave portion 23 and the second concave portion 24) where a step is provided at the inner wall surface, and may be formed by a single groove whose depth is deeper than that of the first groove 21 without providing the step at the inner wall surface.

The metal layer 30 is formed to cover the inner wall surface 21a and the bottom surface 21b of the first groove 21, and the inner wall surface 23a, the bottom surface 23B, the inner wall surface 24a and the bottom surface 24b of the second groove 22. The metal layer 30 may be composed of copper or the like, for example. A plating layer may be formed at a surface of copper or the like that composes the metal layer 30. At this time, it is preferable to use a gold plating, a silver plating or the like that has high reflectance of the irradiated light such as sunlight or the like because the irradiated light is reflected at a surface of the metal layer 30 and is input into the photovoltaic cell 50 so that the efficiency of utilization of the irradiated light can be improved.

At this time, it is preferable that the inclination of each of the inner wall surface 21a of the first groove 21 and the inner wall surfaces 23a and 24a of the second groove 22 is set at an angle by which the irradiated light is easily reflected at the surface of the metal layer 30 to be input into the photovoltaic cell 50 so that the efficiency of utilization of the irradiated light can be further improved. The thickness of the metal layer 30 may be about 10 to 20 μm, for example. Here, the metal layer 30 may be formed to extend at the one surface 20a of the substrate 20. Further, the metal layer 30 may be used as a wiring and may be connected to another wiring through a via wiring or the like.

The pads 40 are formed at the one surface 20a of the substrate 20 and are electrically connected to the photovoltaic cells 50, respectively that are mounted on the photovoltaic cell mounting substrate 10. The pads 40 may be formed by copper or the like, for example. The plan shape of each of the pads 40 may be a circular shape, a rectangular shape or the like, for example. The thickness of the pads 40 may be about 10 to 20 μm, for example.

A plurality (in this embodiment, nine) of the photovoltaic cells 50 is mounted on the photovoltaic cell mounting substrate 10. The photovoltaic cell 50 has a function to output current, generated by photoelectric conversion of irradiated light by a photoelectric conversion layer that is provided at silicon thereof, from electrodes 51 and 52, for example. The electrode 51 is provided at a lower end of the photovoltaic cell 50 and the electrode 52 is provided at an upper end of the photovoltaic cell 50, for example. The photovoltaic cell 50 may have a spherical shape whose diameter is about 1.0 to 2.0 mm, for example. However, the photovoltaic cell 50 may have a flat surface at a portion where the electrode 51 or 52 is formed.

Each of the photovoltaic cells 50 is mounted such that its electrode 51 side is accommodated in the first groove 21 or the second groove 22 that are provided at the substrate 20 of the photovoltaic cell mounting substrate 10, and its electrode 52 projects from the one surface 20a of the substrate 20. The electrode 51 is electrically connected to the metal layer 30 via solder, silver paste or the like (not illustrated in the drawings). The electrode 52 is electrically connected to the respective pad 40 via the respective bonding wire 60 made of a gold wire, a copper wire or the like. The photovoltaic cells 50 are connected in series or in parallel.

By providing external output terminals that are connected to the electrodes 51 and 52 of each of the photovoltaic cells 50 at the one surface 20a and the other surface 20b of the substrate 20 of the photovoltaic cell mounting substrate 10, it is possible to extract the current obtained by photoelectric conversion of each of the photovoltaic cells 50. Here, a part of or all of the current that is obtained by the photoelectric conversion by each of the photovoltaic cells 50 may be consumed in the photovoltaic cell module 1. For example, a semiconductor chip may be mounted on the photovoltaic cell module 1, and the semiconductor chip may be activated using the photovoltaic cells 50 as a power source.

Figure 2:
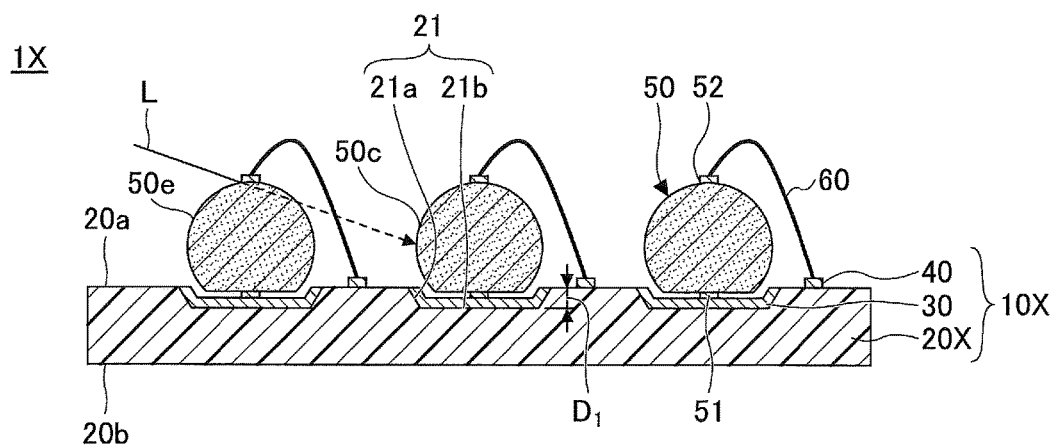
FIG. 2 is a cross-sectional view illustrating an example of a photovoltaic cell module of a comparative example.
Figure 3:
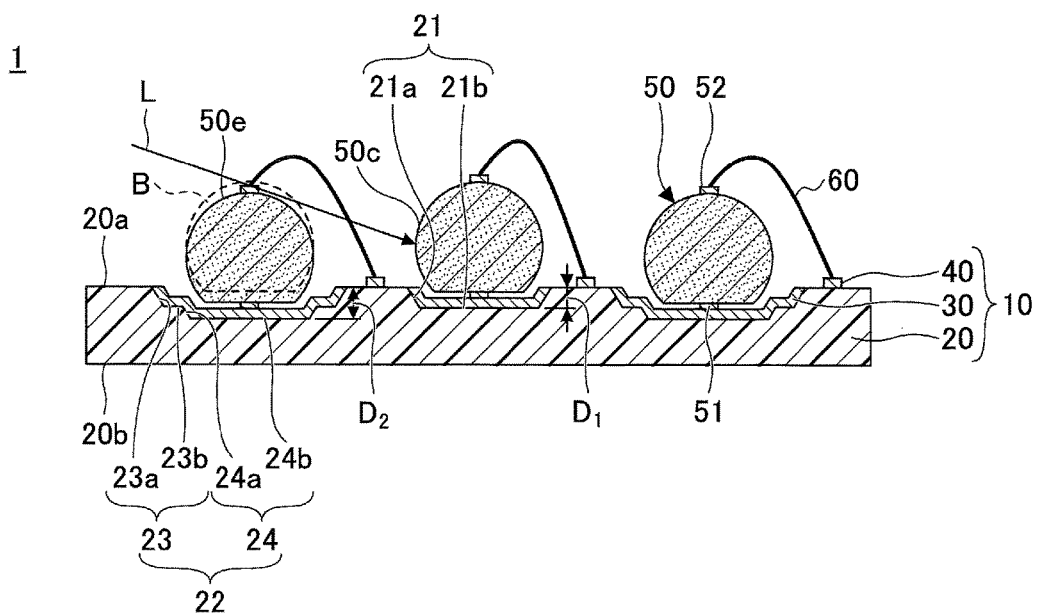
FIG. 3 is a cross-sectional view for explaining an effect of the photovoltaic cell module of the first embodiment.

FIG. 2 is a cross-sectional view illustrating an example of a photovoltaic cell module 1X of a comparative example, and is a cross-section corresponding to FIG. 1A. FIG. 3 is a cross-sectional view for explaining an effect of the photovoltaic cell module 1 of the first embodiment.

The photovoltaic cell module 1X includes a substrate 10X for mounting photovoltaic cells that includes a substrate 20X, instead of the photovoltaic cell module 1 of the photovoltaic cell module 1 of the first embodiment. With reference to FIG. 2, in the photovoltaic cell module 1X of the comparative example, different from the photovoltaic cell module 1, the second grooves 22 are not formed and only the first grooves 21 are formed in the substrate 20X. This means that in the photovoltaic cell module 1X, the depths of all of the grooves that are formed in the substrate 20X are uniform (depth $D_1$).

In FIG. 2 and FIG. 3, for the explanation purpose, the photovoltaic cell 50 at a left side is illustrated as "50e" and the photovoltaic cell 50 at center is illustrated as "50c". For the photovoltaic cell module 1X illustrated in FIG. 2, the photovoltaic cell 50e is mounted at the same height as the photovoltaic cell 50c. Thus, light L that is irradiated from an inclined direction onto the photovoltaic cell module 1X is blocked by the photovoltaic cell 50e and is not irradiated onto the photovoltaic cell 50c. Thus, the amount of light irradiated onto the photovoltaic cell 50c is decreased and the electrical efficiency is lowered.

On the other hand, for the photovoltaic cell module 1 illustrated in FIG. 3, the photovoltaic cell 50e is positioned lower than the photovoltaic cell 50c. Thus, the light L that is irradiated from an inclined direction onto the photovoltaic cell module 1 is irradiated onto the photovoltaic cell 50c without being blocked by the photovoltaic cell 50e. Then, the light is photoelectric converted at the photovoltaic cell 50c. Here, a dashed line B expresses the position of the photovoltaic cell 50e when the photovoltaic cell 50e is positioned at the same height as the photovoltaic cell 50c, for reference.

Further, by appropriately setting the size of an open portion of the second groove 22, even when the photovoltaic cell 50e is placed lower than the photovoltaic cell 50c, the amount of the light irradiated onto the photovoltaic cell 50e from an inclined direction can be increased compared with the case of the photovoltaic cell module 1X. This means that according to the photovoltaic cell module 1, the amount of the light irradiated onto the photovoltaic cell 50e placed in the second groove 22 is increased compared with that of the photovoltaic cell module 1X and the amount of the light irradiated onto the photovoltaic cell 50c placed in the first groove 21 is also increased compared with that of the photovoltaic cell module 1X (efficiency of condensing light is increased). As a result, for the photovoltaic cell module 1, the electrical efficiency can be improved compared with the photovoltaic cell module 1X.

Here, for the photovoltaic cell module 1, it is important to mount the photovoltaic cells 50 (50e) at the peripheral portion of the substrate 20 at a lower position than the photovoltaic cell 50 (50c) at the center portion of the substrate 20. Thus, as long as the photovoltaic cells 50 (50e) at the peripheral portion of the substrate 20 can be mounted at a lower position than the photovoltaic cell 50 (50c) at the center portion, the number of the grooves and the relationship between the depths are not limited to the embodiment illustrated in FIG. 1B and may be arbitrarily determined.

For example, for a case when 16 of the photovoltaic cells 50 are placed in a lattice-like manner, four of the first grooves 21 with the depth $D_1$ may be provided at the center portion of the substrate 20, and 12 of the second grooves 22 with the depth $D_2$ may be provided to surround the circumference of the four first grooves 21. Further, for a case when 25 of the photovoltaic cells 50 are placed in a lattice-like manner, 16 third concave portions with a depth $D_3$ (deeper than the depth $D_2$) may be provided to surround the circumference of the eight second grooves 22 illustrated in FIG. 1B.

Second Embodiment

In the second embodiment, an example is explained in which a method of mounting the photovoltaic cells is different from that of the first embodiment. In the second embodiment, the components same as those explained above are given the same reference numerals, and explanations are not repeated.

Figure 4A:
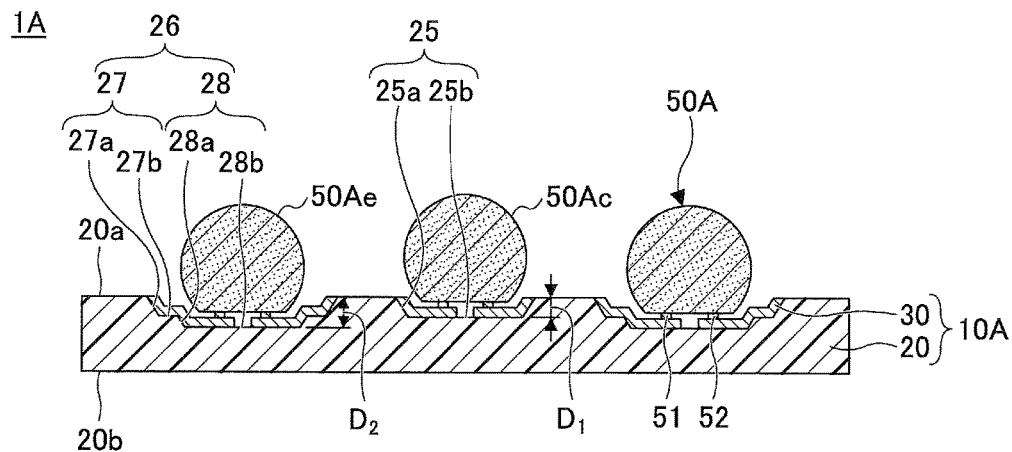
FIG. 4A and FIG. 4B are views illustrating an example of a photovoltaic cell module of a second embodiment.
Figure 4B:
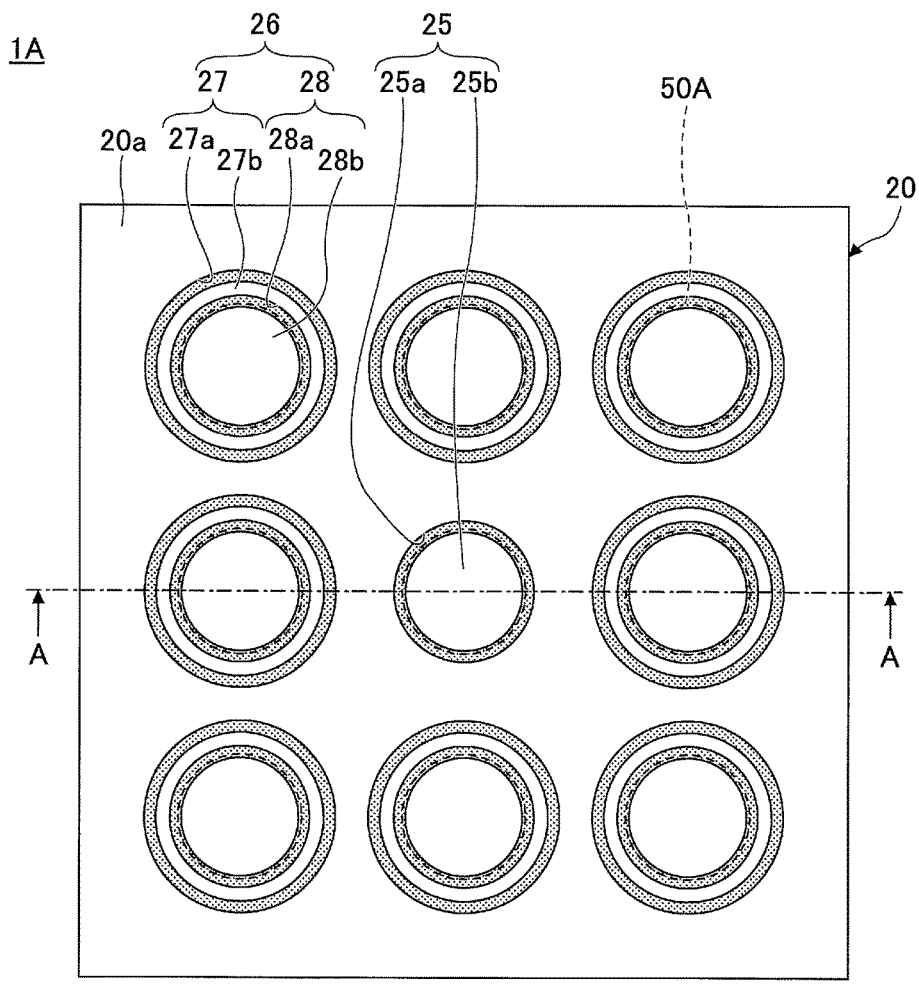

FIG. 4A and FIG. 4B are views illustrating an example of a photovoltaic cell module 1A of the second embodiment. FIG. 4B is a plan view and FIG. 4A is a cross-sectional view taken along an A-A in FIG. 4B. Here, FIG. 4B illustrates a part of the structure illustrated in FIG. 4A. Further, for an illustration purpose, an inner wall surface of each of the grooves is illustrated by a dot pattern in FIG. 4B.

With reference to FIG. 4A and FIG. 4B, the photovoltaic cell module 1A includes a photovoltaic cell mounting substrate 10A and a plurality of photovoltaic cells 50A. Each of the photovoltaic cells 50A has a structure same as the photovoltaic cell 50 (see FIG. 1A and FIG. 1B) except that the positions of the electrodes 51 are 52 are different. In the photovoltaic cell 50A, the electrodes 51 and 52 are provided at a lower end, and thus the photovoltaic cell 50A can be flip-chip mounted on the photovoltaic cell mounting substrate 10A.

The photovoltaic cell mounting substrate 10A includes the substrate 20 and the metal layer 30, and is configured to be capable of mounting the photovoltaic cells 50A. As the photovoltaic cells 50A are not connected to the photovoltaic cell mounting substrate 10A through wire bonding in the photovoltaic cell module 1A, the pads 40 for bonding are not provided at the photovoltaic cell mounting substrate 10A. Instead, in the photovoltaic cell module 1A, the metal layer 30 is patterned to be independently electrically connected to the electrodes 51 and 52, respectively, in order to have each of the photovoltaic cells 50A flip-chip mounted on the photovoltaic cell mounting substrate 10A.

The substrate 20 of the photovoltaic cell mounting substrate 10A is provided with a plurality of grooves including a first groove 25 and second grooves 26. The first groove 25 and the second grooves 26 are provided for mounting the photovoltaic cells 50A, and have a function such as to determine the positions of the photovoltaic cells 50A. The first groove 25 and the second grooves 26 may be, for example, formed by machining, laser processing or the like.

In this embodiment, as an example, the substrate 20 is provided with a single first groove 25 at a substantially center portion of the one surface 20a of the substrate 20. Further, the second grooves 26 are placed at the one surface 20a of the substrate 20 in a lattice-like manner such that to surround the circumference of the first groove 25. However, as long as the second grooves 26 are placed to surround the circumference of the first groove 25, the second grooves 26 may not be placed in a lattice-like manner and, for example, the second grooves 26 may be formed in a zigzag manner.

The depth $D_2$ of the second groove 26 with respect to the one surface 20a of the substrate 20 is deeper than the depth $D_1$ of the first groove 25 with respect to the one surface 20a of the substrate 20. Similar to the first embodiment, the depth $D_1$ may be arbitrarily determined based on the size or the like of the photovoltaic cell 50A to mount.

The first groove 25 has an inner wall surface 25a and a bottom surface 25b that is continuously formed from the inner wall surface 25a. The plan shape of the first groove 25 may be, for example, a circular shape. When the photovoltaic cell 50A to mount has a spherical shape whose diameter is about 1.0 to 2.0 mm, the diameter of the first groove 25 may be, for example, about 1.0 to 2.0 mm. The inner wall surface 25a of the first groove 25 may have a tapered shape where the one surface 20a side of the substrate 20 is wider, for example, and alternatively, the inner wall surface 25a of the first groove 25 may be substantially perpendicular to the one surface 20a of the substrate 20.

Each of the second grooves 26 has a stepped structure where a step is provided at the inner wall surface. In other words, each of the second grooves 26 includes a first concave portion 27 (depth $D_1$) whose depth is substantially the same as that of the first groove 25 and a second concave portion 28 (depth $D_2$) that is formed at a substantially center portion of a bottom surface of the first concave portion 27 and smaller than the first concave portion 27 such that to be one step deeper (lower) than the first concave portion 27.

The first concave portion 27 has an inner wall surface 27a and a bottom surface 27b that is continuously formed from the inner wall surface 27a. The second concave portion 28 has an inner wall surface 28a and a bottom surface 28b that is continuously formed from the inner wall surface 28a. The inner wall surface 28a of the second concave portion 28 is continuously formed from the bottom surface 27b of the first concave portion 27 to form the continuous stepped structure.

The plan shape of the second concave portion 28 may be, for example, a circular shape whose diameter is about the same as that of the first groove 25. The plan shape of the first concave portion 27 may be, for example, a circular shape whose diameter is larger than that of the second concave portion 28 by about a few ten to a few hundred μm. The first concave portion 27 and the second concave portion 28 may be concentrically formed.

The inner wall surface 27a of the first concave portion 27 and the inner wall surface 28a of the second concave portion 28 may have a tapered shape where the one surface 20a side of the substrate 20 is wider, for example. Alternatively, the inner wall surface 27a of the first concave portion 27 and the inner wall surface 28a of the second concave portion 28 may be substantially perpendicular to the one surface 20a of the substrate 20. Here, the second groove 26 may not have the stepped structure (the structure including the first concave portion 27 and the second concave portion 28) where a step is provided at the inner wall surface, and may be formed by a single groove whose depth is deeper than that of the first groove 25 without providing the step at the inner wall surface.

Although the first groove 25 and the second grooves 26 each having a circular shape are explained for the second embodiment, this is not limited so. Each of the grooves may be a pair of semicircular shape grooves.

The metal layer 30 is formed to cover the inner wall surface 25a and the bottom surface 25b of the first groove 25, and the inner wall surface 27a, the bottom surface 27b, the inner wall surface 28a and the bottom surface 28b of the second groove 26. In order to have each of the photovoltaic cells 50A flip-chip mounted on the substrate 10A for mounting photovoltaic cells, the metal layer 30 is patterned such that to be capable of being independently electrically connected to the electrodes 51 and 52. For example, the plan shape of the metal layer 30 in each of the grooves may be a pair of semicircular shapes.

The shape of each of the first groove 25, the second groove 26 and the metal layer 30 in each of the grooves is not limited to a circular shape or a semicircular shape, and may be various shapes such as a rectangular shape, a polygonal shape, a linear shape or the like.

In FIG. 4A, for the explanation purpose, the photovoltaic cell 50A at a left side is illustrated as "50Ae" and the photovoltaic cell 50A at center is illustrated as "50Ac". For the photovoltaic cell module 1A, the photovoltaic cell 50Ae that is placed in each of the second grooves 26 is positioned lower than the photovoltaic cell 50Ac that is placed in the first groove 25. Thus, the amount of the light irradiated onto the photovoltaic cell 50Ac increases without being blocked by the photovoltaic cell 50Ae. Further, by appropriately setting the size of an open portion of the second groove 26, the amount of the light irradiated onto the photovoltaic cell 50Ae placed in the second groove 26 from the inclined direction can be increased compared with the case of the photovoltaic cell module 1X. As a result, similar to the photovoltaic cell module 1, for the photovoltaic cell module 1A, the electrical efficiency can be improved compared with the photovoltaic cell module 1X.

Alternative Example of First Embodiment

In an alternative example of the first embodiment, an example is explained in which the photovoltaic cells are covered by resin. In the alternative example of the first embodiment, the components same as those explained above are given the same reference numerals, and explanations are not repeated.

Figure 5A:
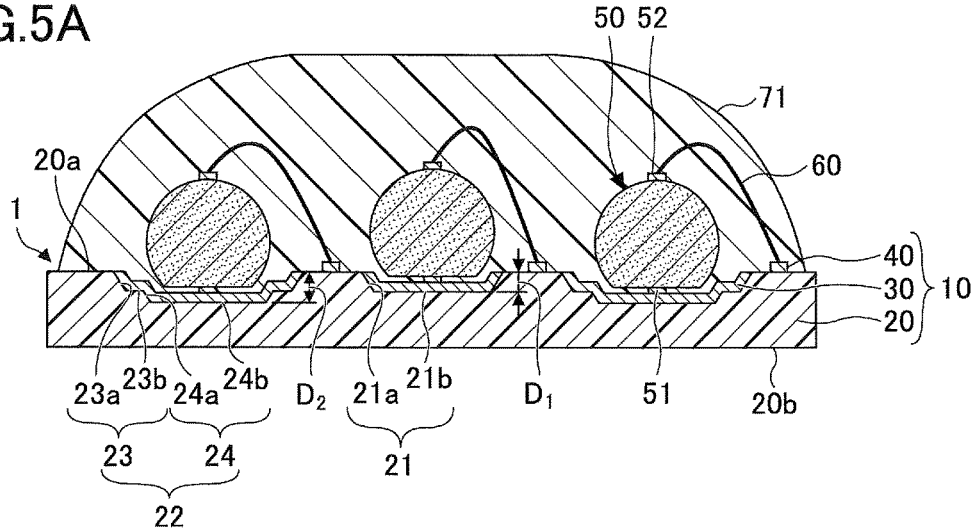
FIG. 5A to FIG. 5C are cross-sectional views illustrating an alternative example of the photovoltaic cell module of the first embodiment.
Figure 5B:
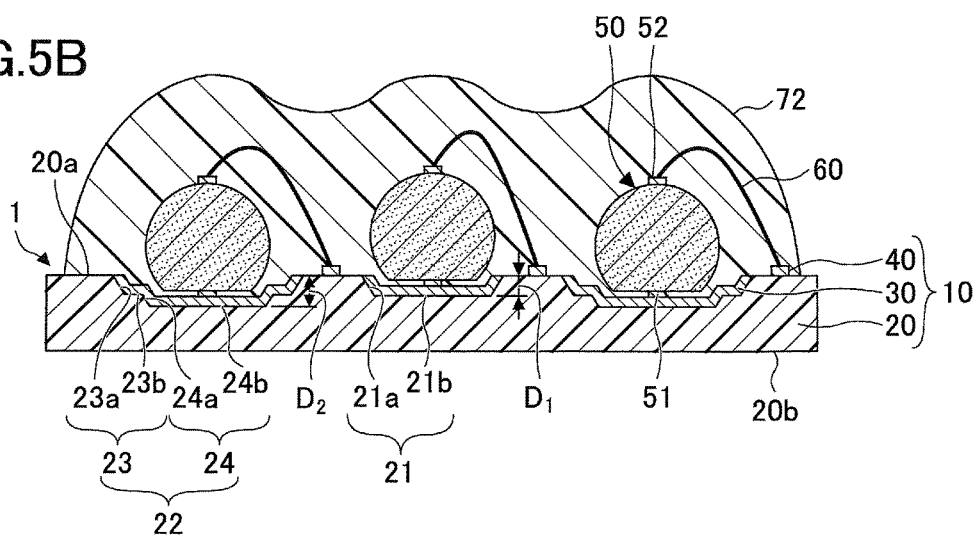
Figure 5C:
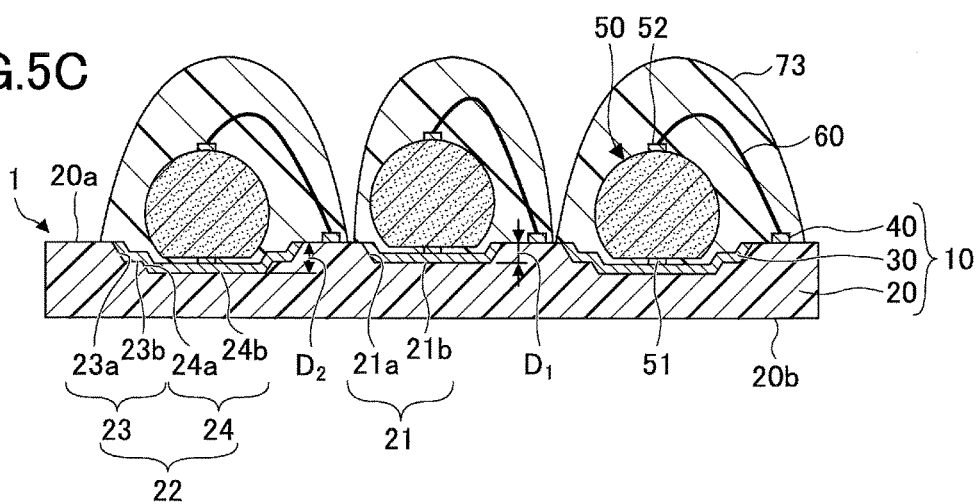

FIG. 5A to FIG. 5C are cross-sectional views illustrating an example of a photovoltaic cell module of an alternative example of the first embodiment, and are cross-sections corresponding to FIG. 1A.

As illustrated in FIG. 5A, resin 71 that is transparent to the light irradiated onto the photovoltaic cells 50 may be provided to have a convex shape to cover all of the photovoltaic cells 50 in the photovoltaic cell module 1. By appropriately setting a curved surface of the convex shaped resin 71, efficiency of condensing light of the light irradiated onto each of the photovoltaic cells 50 can be increased. Thus, the electrical efficiency can be further improved compared with the case illustrated in FIG. 1A and FIG. 1B.

Further, as illustrated in FIG. 5B, resin 72 that is transparent to the light irradiated onto the photovoltaic cells 50 may be provided to have a convex shape to cover all of the photovoltaic cells 50 in the photovoltaic cell module 1. The resin 72 is formed to have the convex shape that corresponds to the shapes of the photovoltaic cells 50 such that the efficiency of condensing light for each of the photovoltaic cells 50 is optimized. The resin 72 is formed to have convex portions corresponding to the photovoltaic cells 50, respectively, and thus the efficiency of condensing light irradiated onto each of the photovoltaic cells 50 is further increased. Therefore, the electrical efficiency can be further increased compared with the case illustrated in FIG. 5A.

When covering the photovoltaic cells 50 by resin to correspond to the shapes of the photovoltaic cells 50, as illustrated in FIG. 5C, transparent resin 73 may be provided to independently cover each of the photovoltaic cells 50. At this time, the effect same as that of the case illustrated in FIG. 5B can be obtained. Here, for the resins 71 to 73, for example, vinyl acetate (EVA) or the like may be used.

According to the embodiments, a photovoltaic cell mounting substrate or the like capable of improving electrical efficiency when mounting photovoltaic cells thereon is provided.

Although a preferred embodiment of the photovoltaic cell mounting substrate and the photovoltaic cell module has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, in the photovoltaic cell module 1, the plan shape of each of the first groove 21 and the second grooves 22 may be a strip shape, not the circular shape as illustrated in FIG. 1B, and the strip grooves may be aligned with a predetermined space. At this time, the plurality of photovoltaic cells 50 may be placed in the first groove 21 to align as a line. Similarly, the plurality of photovoltaic cells 50 may be placed in the second groove 22 to align as a line. In this case as well, the amount of the light that is irradiated from the predetermined direction and irradiated onto the photovoltaic cell 50 placed in the first groove 21 is increased without being blocked by the photovoltaic cell 50 placed in the second groove 22. Thus, the electrical efficiency of the photovoltaic cell module 1 can be improved compared with the photovoltaic cell module 1X. This alternative example can be applicable for the photovoltaic cell module 1A as well.

What is claimed is:

1. A photovoltaic cell module comprising a photovoltaic cell mounting substrate; the substrate comprising:
    a first groove configured to mount a first photovoltaic cell; and
    a second groove configured to mount a second photovoltaic cell,
    the first groove and the second groove being provided in one surface of the substrate,
    the second groove being placed at a circumferential side of the first groove, in the one surface of the substrate, and
    the second groove being formed deeper than the first groove, with respect to the one surface of the substrate,
    wherein the first photovoltaic cell is mounted in the first groove and the second photovoltaic cell is mounted in the second groove, the second photovoltaic cell is positioned deeper than the first photovoltaic cell, with respect to the one surface of the substrate,
    wherein the substrate has another surface opposite the one surface,
    wherein the first groove and the second groove each have a highest point and a lowest point,
    wherein the highest point of the first groove and the highest point of the second groove are an equal distance from the another surface of the substrate, and wherein the second groove has a stepped structure including a first concave portion whose depth is the same as the depth of the first groove and a second concave portion formed at a bottom surface of the first concave portion to be smaller than the first concave portion, the second concave portion being formed deeper than the bottom surface of the first concave portion.

2. The photovoltaic cell module according to claim 1, wherein each of the first groove and the second groove is configured to mount a single photovoltaic cell.

3. The photovoltaic cell module according to claim 1, further comprising a plurality of the second grooves that are placed to surround the first groove.

4. The photovoltaic cell module according to claim 1, further comprising:
    a metal layer formed at a bottom surface and an inner wall surface of each of the first groove and the second groove.

5. The photovoltaic cell module according to claim 1, wherein each of the first photovoltaic cell and the second photovoltaic cell has a spherical shape, and
    wherein the photovoltaic cell module further comprises resin that is transparent to light irradiated onto the first photovoltaic cell and the second photovoltaic cell to cover the first photovoltaic cell and the second photovoltaic cell, the resin being formed to have a convex shape corresponding to the shapes of the first photovoltaic cell and the second photovoltaic cell.

6. The photovoltaic cell module according to claim 1, wherein the first groove and the second groove are configured such that, when the first photovoltaic cell and the second photovoltaic cell having the same size are mounted on the first groove and the second groove, respectively, the position of the top of the second photovoltaic cell becomes closer to the one surface of the substrate than the position of the top of the first photovoltaic cell.

7. The photovoltaic cell module according to claim 1, wherein the first groove and the second groove are formed not to overlap with each other in a plan view.

8. The photovoltaic cell module according to claim 1, further comprising a plurality of the second grooves each configured to mount a second photovoltaic cell,
    wherein the first groove is provided in a center portion of the one surface of the substrate, and the second grooves are provided to surround the first groove in the one surface of the substrate.

9. The photovoltaic cell module according to claim 1, wherein the one surface of the substrate is a planar surface.

10. A photovoltaic cell module comprising a photovoltaic cell mounting substrate; the substrate having a planar surface;

a first concaved groove having a first depth formed in the planar surface; and a second concaved groove having a second depth formed in the planar surface, wherein the first concaved groove is placed at center of the planar surface with respect to the second concaved groove, wherein the second depth is deeper than the first depth, wherein the first concaved groove and the second concaved groove are configured wherein a first photovoltaic cell is mounted in the first concaved groove and a second photovoltaic cell is mounted in the second concaved groove, the second photovoltaic cell is positioned deeper in the planar surface than the first photovoltaic cell in the planar surface, and wherein the second concaved groove has a stepped structure including a first concave portion whose depth is the same as the depth of the first concaved groove and a second concave portion formed at a bottom surface of the first concave portion to be smaller than the first concave portion, the second concave portion being formed deeper than the bottom surface of the first concave portion.

* * * * *